United States Patent [19]
Plis et al.

[11] Patent Number: 5,995,022
[45] Date of Patent: *Nov. 30, 1999

[54] METHOD AND APPARATUS FOR EXECUTING A COMMAND IN A PLURALITY OF ELECTRICAL METERING DEVICES

[75] Inventors: Mark J. Plis, Strafford County, N.H.; Kevin P. Grogan, York County, Me.

[73] Assignee: General Electric Company, Schenectady, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/744,131

[22] Filed: Nov. 5, 1996

Related U.S. Application Data

[63] Continuation of application No. 08/158,030, Nov. 26, 1993, abandoned.

[51] Int. Cl.⁶ ................................ G08B 23/00
[52] U.S. Cl. .................. 340/870.02; 340/870.03; 364/464.04
[58] Field of Search ................ 379/107; 340/870.02, 340/870.03, 870.05, 870.11, 870.15, 825.06, 309.15, 310.01; 364/464.04

[56] References Cited

U.S. PATENT DOCUMENTS

| | | | |
|---|---|---|---|
| 4,442,492 | 4/1984 | Karlsson | 340/870.02 |
| 4,455,453 | 6/1984 | Parasekuakos | 379/107 |
| 4,697,180 | 9/1987 | Swanson | 340/870.02 |
| 4,749,992 | 6/1988 | Fitzemeyer et al. | 340/870.02 |
| 4,940,976 | 7/1990 | Gastouniotis | 340/870.02 |
| 5,239,575 | 8/1993 | White | 340/870.02 |
| 5,301,122 | 4/1994 | Halpern | 340/870.02 |

*Primary Examiner*—Michael Horabik
*Assistant Examiner*—Albert K. Wong
*Attorney, Agent, or Firm*—Armstrong Teasdale LLP

[57] ABSTRACT

A method and apparatus for executing a command in a number of electrical metering devices of a power distribution system provides each metering device with a command having a predetermined execution time and subsequently executes the command in each of the metering devices once the present time value equals or exceeds the predetermined execution time. Each electrical metering device includes a clock for providing the present time value as well as a memory device for receiving and storing the command. Each electrical metering device also includes at least one controller or microprocessor for monitoring or comparing the present time value with the predetermined execution time of the stored command and for executing the stored command once the present time value is at least as large as the predetermined execution time. A command may thus be provided to each electrical metering device of a power distribution system at various prior arbitrary times. The command may subsequentially be executed simultaneously in each of the electrical metering devices at the predetermined execution time.

25 Claims, 3 Drawing Sheets

METHOD AND APPARATUS FOR EXECUTING A COMMAND IN A PLURALITY OF ELECTRICAL METERING DEVICES

This is a continuation of of application Ser. No. 08/158,030 filed Nov. 26, 1993, abandoned.

FIELD OF THE INVENTION

The present invention relates to a method and apparatus for programming an electrical metering device and, more particularly, to a method and apparatus for programming a plurality of electrical metering devices.

BACKGROUND OF THE INVENTION

Modern electrical power distribution systems supply power to a large number of electrical loads, such as residences, factories or businesses. The power consumed by each electrical load is separately measured by an electrical metering device, such as an induction or electronic type watthour meter. Many electrical power distribution systems include tens of thousands or even hundreds of thousands of metering devices.

Induction type watthour meters have historically been utilized to measure electrical energy consumption. Induction type watthour meters include an aluminum disk driven as a rotor of a small induction motor by an electric field at a speed which is proportional to the electric power consumed by the load. Geared dials, or cyclometer disks, integrate the disk's motion to indicate the total energy consumed, conventionally measured in kilowatt hours.

Recently, an increasing number of electronic type watthour meters have been employed to measure electrical energy consumption since they are capable of measuring several quantities in addition to tabulating the kilowatt hours of power consumed by the corresponding load. For example, electronic type watthour meters can measure the power factor, kilovolt amperes ("KVA"), and reactive volt amperes of the power consumed. The increased metering flexibility and capacity provided by electronic type watthour meters is due, at least in part, to the electronic acquisition, integration and processing of the measured electrical consumption of the load by, for example, an electronic processor or controller.

The total electrical power demand upon most power distribution systems is cyclical throughout each day with one or more peaks in the demand for electrical energy. The cyclical electrical energy demand is relatively consistent such that the peaks in electrical energy demand occur at substantially the same time each day. Likewise, the off-peak time periods also occur at relatively the same times of each day. Thus, many suppliers of electrical power charge more for electrical energy consumption during the peak periods of time during a day than during the off-peak periods to reflect the increased cost of supplying the power during the peak periods.

Due to their electronic processing capabilities, electronic type watthour meters readily provide time of use metering. Time of use metering separately tabulates the electrical consumption of the load during distinct, predetermined periods of time. Electronic time of use watthour meters, therefore, may measure the electrical energy consumption separately during the predetermined off-peak and peak periods of time. Separate billing rates may thereafter be applied to the electrical consumption during those periods of time by the suppliers of the electrical power.

Electronic type watthour meters typically include a number of programmed instructions and predefined values stored in a non-volatile memory device associated with the electronic controller or processor for controlling the meter's operation. For example, the particular times of day defining off-peak and peak periods may be stored. The instructions and values are originally stored during the initialization of the electronic watthour meter. In many instances, the instructions or values must be modified after the electronic watthour meter has been installed, such as, for example to modify the times of the day defining the off-peak and peak periods for a electronic time of use watthour meter.

There are several methods of communicating with electronic type watthour meters so as to modify the pre-programmed instructions or values. For example, the modified instructions and values may be manually entered into the memory of the electronic watthour meters. Alternatively, some electronic watthour meters include an optical communications port. For these meters, the modified instructions or values may be downloaded, via an optical probe, to the electronic watthour meter.

In addition, other electronic watthour meters include a radio frequency ("RF") receiver or transceiver. For these meters, the revised instructions or values may be broadcast, such from a central station or radio tower, to the electronic watthour meters. Still other electronic watthour meters communicate with a central station via the telephone lines. These electronic watthour meters typically include a modem adapted to receive signals from and transmit signals via the telephone lines.

Power line communications may also be utilized to reprogram electronic watthour meters. A typical power line communication system, such as that illustrated in U.S. Pat. No. 4,749,992 to Fitzemeyer, includes a central control station, typically referred to as a system control center, which transmits signals to one or more radio towers. The signals may be transmitted to the radio tower by RF transmission or by cable television or telephone lines or by a satellite or microwave link. Each radio tower, in turn, rebroadcasts the signals to a plurality of nodes, such as by RF transmission. Each node is typically a remote local relay module associated with a distribution transformer. Each relay module then transmits the signals via the consumer electronics bus ("CEBus") to the electrical metering devices connected between the secondary side of the associated distribution transformer and the electrical loads.

The CEBus includes the power lines extending from the distribution transformer to the electrical loads, i.e. residences or businesses, as well as the electrical wiring within the residences or businesses. As known to those skilled in the art, signals are transmitted via the CEBus according to a predefined format or protocol. One standard protocol for CEBus signals is established by the Electronic Industries Association of Washington, D.C. in a publication entitled "EIA Home Automation System (CEBus) EIA IS-60" and published October, 1992.

The electronic type watthour meters coupled to the electrical loads of the distribution transformer include a modem for receiving and translating the signals transmitted via the power line. The modem thereafter provides the translated signal to the controller or processor for immediate execution.

One power line communications system is the UCNet® system marketed by General Electric Company, assignee of the present invention. The UCNet™ system is described and illustrated in a brochure entitled "GE UCNet System" by GE Meter and Control of Somersworth, N.H. which bears document number GEA 12091 9/91 7M. The UCNet™ system is also described in a publication entitled "Engineering Presentation To AEIC/EEI Meter and Service Committees" by GE Meter and Control which bears document number GET-6638.22 9/91 (3M).

In addition, some electrical power distribution systems include combinations of the various methods for reprogramming an electrical type watthour meter. Thus, a first group of electrical metering devices may be reprogrammed, for example, via power line communication while a second group of meters may be reprogrammed via optical communications.

Since a typical power distribution system includes tens of thousands or even hundreds of thousands of electronic metering devices, it has not been possible to simultaneously reprogram each electronic metering device regardless of the method by which the electronic watthour meters are reprogrammed. Accordingly, there may be significant differences in operation and performance between the electronic metering devices which have and those which have not been reprogrammed. These operational and performance differences will continue until all of the meters have been reprogrammed.

In many instances, it would be desirable for the revised instructions or values to become effective in each meter of the power distribution system simultaneously. For example, the modified instructions or values may redefine the off-peak and peak time periods. It would thus be desirable that the revised off-peak and peak time periods be simultaneously effective in each electronic metering device so that the electrical consumption of each load is allocated and billed identically in each metering device. Although it would be desirable to simultaneously reprogram each electronic metering device of a power distribution system, the present methods for reprogramming electronic metering devices impose significant delays in the times at which the modified instructions or values are effective in the metering devices.

SUMMARY OF THE INVENTION

It is therefore an object of the invention to provide an improved method and apparatus for reprogramming electrical metering devices.

It is another object of the invention to provide an improved method and apparatus for simultaneously executing a command in a plurality of electronic metering devices.

It is a further object of the invention to provide an improved method and apparatus for storing a command in a plurality of electrical metering devices for execution at a future predetermined time.

These and other objects are provided, according to the invention, by an electrical metering system which provides a command, including a predetermined time for its execution, to a plurality of electrical metering devices which each execute the command when the predetermined time has arrived. Thus, a command which is loaded in the plurality of metering devices at a prior, arbitrary time is simultaneously executed in each of the metering devices.

In particular, each electrical metering device is individually coupled to an electrical load and includes metering means for measuring the electrical consumption of the load as well as register means for tabulating the measured electrical consumption. Each electrical metering device also includes clock means, preferably a real time clock, for providing a present time value and a communications interface means for receiving and storing the command. Still further, each electrical metering device includes means for comparing the present time value provided by the clock means with the predetermined execution time of the command as well as means, responsive to the comparing means, for executing the stored command once the present time value is at least as large as the predetermined execution time. Accordingly, a command stored at some prior time in a plurality of electrical metering devices may be simultaneously executed at the predetermined time in each of the metering devices.

The communications interface means preferably includes memory means for storing the command as well as a system controller, such as a microcontroller or microprocessor. The system controller of the communications interface means preferably includes the means for comparing the present time value in the predetermined execution time of the command.

Each electrical metering device also preferably includes means for controlling the electrical metering device, such as a controller or microprocessor. The controlling means preferably includes the register means and the means for executing the stored command once the present time value is at least as large as the predetermined execution time.

In one embodiment, the system controller of the communications interface means, including the comparing means, includes a first microprocessor and the controlling means, including the executing means, includes a second microprocessor. In an alternative embodiment, each electrical metering device has a single system controller or microprocessor which includes both the comparing means and the executing means.

Preferably, the executing means includes the means for executing the stored command once the present time value equals the predetermined execution time. In preferred embodiments, a common command, including the same predetermined execution time, is stored in each metering device. Thus, the command is executed simultaneously in each of the plurality of metering devices.

The commands may be provided to the electrical metering devices of the present invention by all methods known to those skilled in the art for reprogramming an electrical metering device. These methods include reprogramming a metering device via optical communications or manual entry of the command, as well as transmission of the command via the telephone lines, RF signals or an electrical power line to a metering device.

Therefore, the method and apparatus for executing a command in a plurality of electrical metering devices according to the present invention allows a command to be provided to and stored by a plurality of electrical metering devices at some arbitrary time prior to the predetermined time for the execution of the command. The command may thereafter be simultaneously executed in the plurality of electrical metering devices at the predetermined execution time. Accordingly, the command will become effective in each of the plurality of electrical metering devices of the power distribution system at the same time.

DESCRIPTION OF THE PREFERRED EMBODIMENTS

The present invention now will be described more fully hereinafter with reference to the accompanying drawings, in which a preferred embodiment of the invention is shown. This invention may, however, be embodied in many different forms and should not be construed as limited to the embodiments set forth herein; rather, this embodiment is provided so that this disclosure will be thorough and complete and will fully convey the scope of the invention to those skilled in the art. Like numbers referred to like elements throughout.

Figure 1:
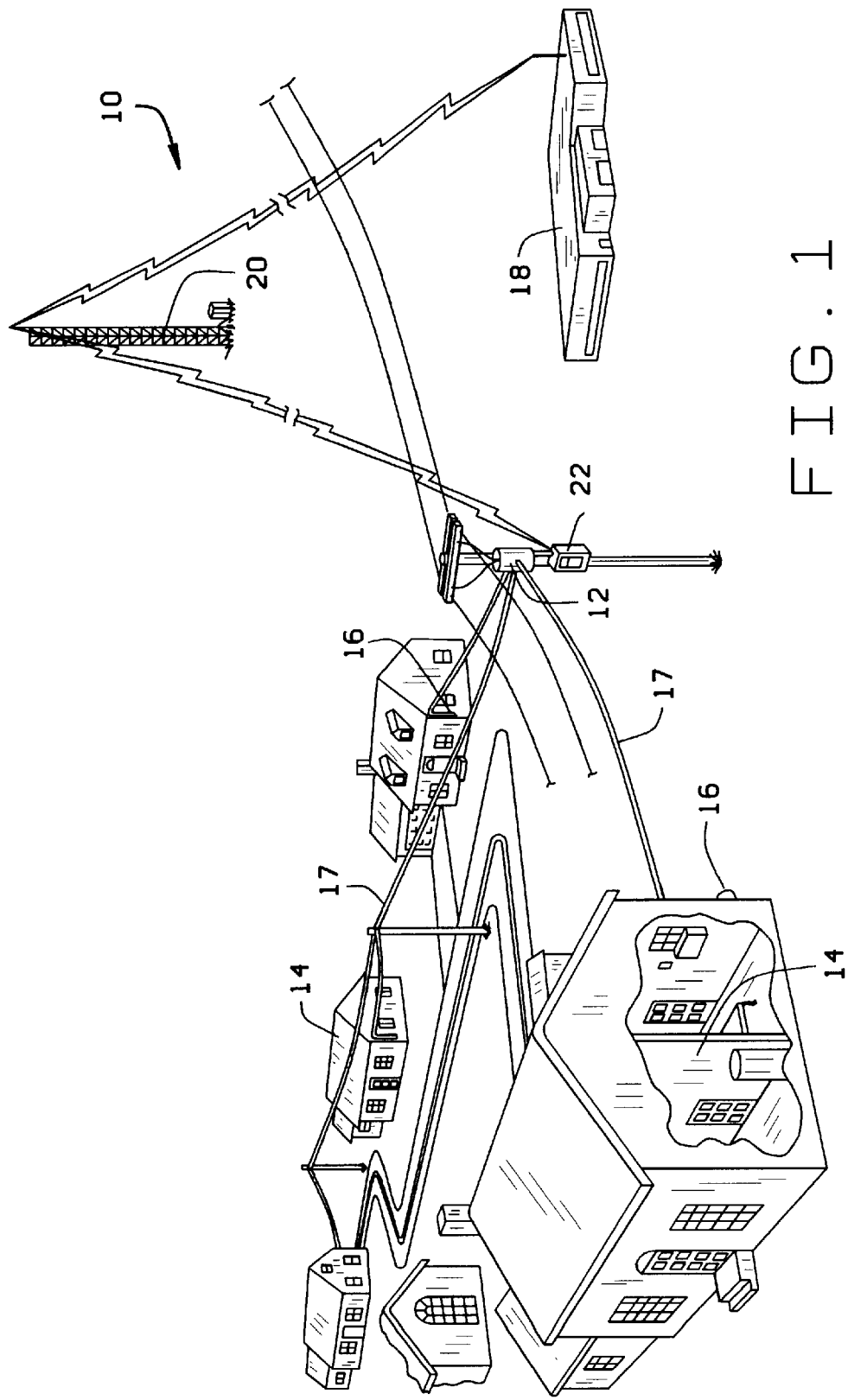
FIG. 1 is a perspective view of a power line communicationions system for providing a command to a plurality of electrical metering devices according to the present invention.

Referring now to FIG. 1, a portion of an electrical power distribution and communication system 10, such as the UCNet™ system, is illustrated. The electrical power distribution system 10 includes a plurality of distribution transformers 12. The secondary side of the distribution transformers 12 is generally connected to a plurality of electrical loads 14. The electrical loads 14 are typically residential homes, businesses or factories which consume electrical power. An electrical metering device 16, such an electronic type watthour meter, is coupled to each of the plurality of electrical loads 14 for measuring the electrical consumption of the corresponding load 14.

The electrical metering system of the present invention includes means for providing a signal or command, including a predetermined time for the command's execution, to a plurality of electrical metering devices 16. FIG. 1 illustrates one embodiment of the command providing means in which commands may be transmitted via electrical power lines 17 to the plurality of electrical metering devices 16. The power line communications system includes a central control station 18, typically referred to as a system control center, which transmits commands to a plurality of radio towers 20. The transmission of commands from the system control center 18 to the radio towers 20 is preferably via RF signals. However, the commands may instead be transmitted via cable television or telephone lines or by a satellite or microwave link.

As illustrated in FIG. 1, the radio tower 20 thereafter broadcasts the signals to a plurality of nodes 22. Each node 22 is preferably a remote local relay module associated with a distribution transformer 12. The node 22 receives the command and, in turn, transmits the command, via a consumer electronics bus including a power line 17, to each electrical metering device 16 which is coupled to an electrical load 14 of the associated distribution transformer 12.

Each electrical metering device 16, adapted for receiving power line communications, preferably includes a modem 23 for receiving signals from and transmitting signals to the power line 17. For signals transmitted from the node 22 via the consumer electronics bus, the signals are preferably formatted according to CEBus protocol as established by the Electronic Industries Association and discussed above. In particular, the modem 23 receives the command from the power line 17 and transmits the command for execution or storage within the electrical metering device 16. One typical modem 23 for power line communications is the Intellon SSM10CE spread spectrum power line communication microchip. Thus, a command may be transmitted from the system control center 18 to each electrical metering device 16 of the utility distribution network 10.

While a power line communications system is illustrated in FIG. 1 and is one embodiment of the command providing means, the electrical metering system of the present invention also encompasses other means or combinations of means for providing a command to the electrical metering devices 16 of a power distribution network as are known to those skilled in the art. For example, commands may be transmitted via RF signals directly to electrical metering devices 16 which incorporate an RF receiver. Alternatively, commands may be transmitted via the telepone lines to electrical metering devices 16 which include an appropriately configured modem to receive and process the commands. In addition, commands may be provided to the plurality of electrical metering devices 16 by optical communications with metering devices 16 having optical ports or by manual entry of the command in the electrical metering devices 16.

Figure 2:
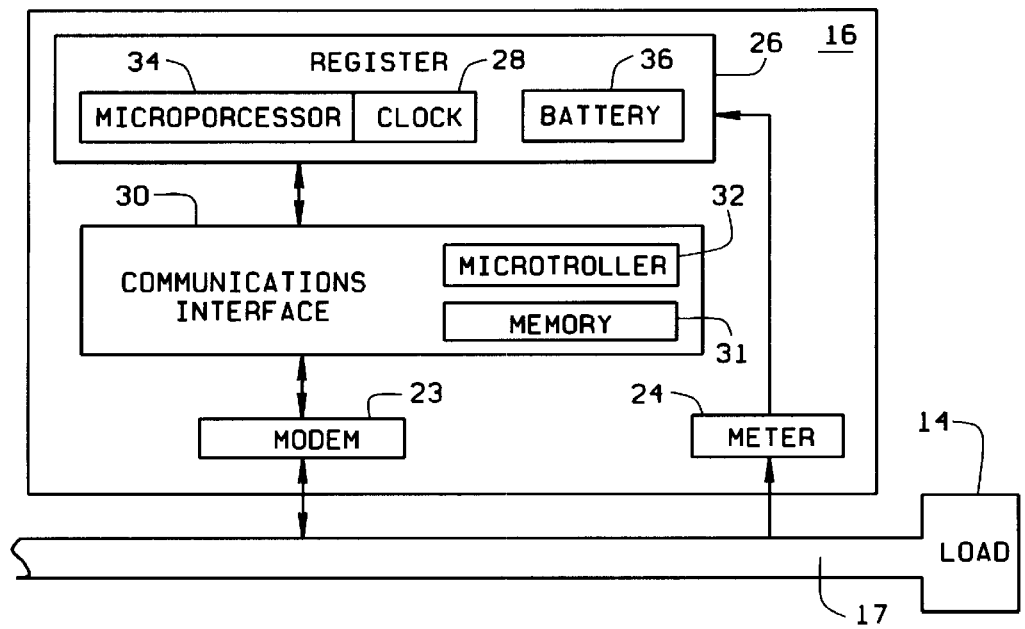
FIG. 2 is a block diagram of an electrical metering device according to the present invention.

Referring now to FIG. 2, an electrical metering device 16 of an electrical metering system according to the present invention is illustrated in block diagram form. Each electrical metering device 16 preferably includes metering means 24 for measuring the electrical consumption of the load 14 to which the metering device 16 is coupled. The metering means 24 typically produces a pulse for each quantum of energy consumed by the corresponding load 14. Alternatively, the metering means 24 may produce a signal having a frequency or pulse repetition rate related to the energy consumed by the corresponding load 14. Each electrical metering device 16 also preferably includes register means 26, responsive to the metering means 24, for tabulating the electrical consumption of the load 14.

In addition, each electrical metering device 16 includes clock means 28 for providing a present time value. It will be understood that the present time value may be provided in many formats, such as year, month, day, hour, minute and seconds; or days from the first of the year plus minutes and seconds; or minutes and seconds from the first day of the year. Other formats are known to those skilled in the art.

Figure 3:
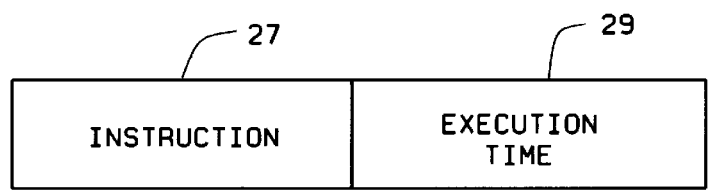
FIG. 3 is a block diagram of a command, including a predetermined execution time, which is stored and executed according to the present invention.

Each electrical metering device 16 of the present invention also typically includes communications interface means 30 for receiving and storing the command transmitted by the command providing means as well as means for monitoring the present time values provided by the clock means 28. As illustrated schematically in FIG. 3, each command includes an instruction 27 and a predetermined execution time 29. The predetermined execution time 29 may be provided in many formats as discussed above with respect to the present time value provided by the clock means 28.

As illustrated in FIG. 2, an electrical metering device 16 adapted to recieve power line communications preferably includes a modem 23 for receiving the command from the power line 17 and providing the command to the communications interface means 30. Alternatively, the electrical metering device 16 and, more particularly, the communications interface means 30 may receive the command via manual entry, optical communication, RF transmission or transmission via the telephone lines as previously discussed.

The monitoring means of the communications interface means 30 preferably includes means for comparing the present time value with the predetermined execution time of the command stored by the communications interface means 30. The communications interface means 30 also preferably includes memory means 31 and, more preferably includes a non-volatile memory device, such as electrical erasable programmable read only memory ("EEPROM") for receiving and storing the command.

Each electrical metering device 16 also preferably includes means, responsive to the comparing means, for executing the stored command once the present time value is at least as large as the predetermined execution time. Thus, a command may be stored in a plurality of electrical metering devices 16 at a prior, arbitrary time for execution in each of the electrical metering devices 16 at the predetermined execution time of the command.

In one embodiment of the present invention, both the comparing means and the executing means comprise a single system controller or microprocessor. In another embodiment of the present invention, illustrated in FIG. 2, the communications interface means 30 preferably includes a first microcontroller or microprocessor 32 such as a Motorola 68HC11A1 microcontroller. The microcontroller 32 of the communications interface means 30 preferably includes the means for comparing the present time value with the predetermined execution time. The first microcontroller 32 also preferably includes at least one predetermined memory location in which a flag may be set to indicate that a command has been stored and is awaiting execution. In this embodiment, the flag triggers the monitoring of the present time value and its comparison with the predetermined execution time.

Each electrical metering device 16 according to the embodiment illustrated in FIG. 2 also preferably includes means, operably connected to the metering means 24 and the communications interface means 30, such as by a ten bit parallel port, for controlling the electrical metering device 16. The controlling means preferably includes the register means 26 for tabulating the electrical consumption of the load 14 and the means for executing the stored command once the present time values is at least as large as the predetermined execution time. The controlling means is preferably a second system controller or microprocessor 34.

As illustrated, the controlling means or, more preferably the system controller or microprocessor 34, may also include the clock means 28. In other embodiments, the clock means 28 may be seperate from the system controller and may include an independent clock generator. In still other embodiments, both the controlling means and communications interface means 30 may include individual clock means 28. In each embodiment, however, the present time values provided by the clock means 28 are provided to both the communications interface means 30 and the controlling means. The clock means 28 preferably includes a real time clock which is set during the initial programming of the electrical metering device 16. Most preferably, the real time clocks of each of the plurality of electrical metering devices 16 are synchronized.

Each electrical metering device 16 also preferably includes means, such as battery 36, for supplying auxiliary power to the metering device 16. Thus, power may be maintained within the electrical metering device 16 during a power outage. Accordingly, the clock means 28 will continue to provide the present time value, preferably the real time, throughout a power outage and does not need to be re-initialized following resumption of power delivery.

Figure 4:
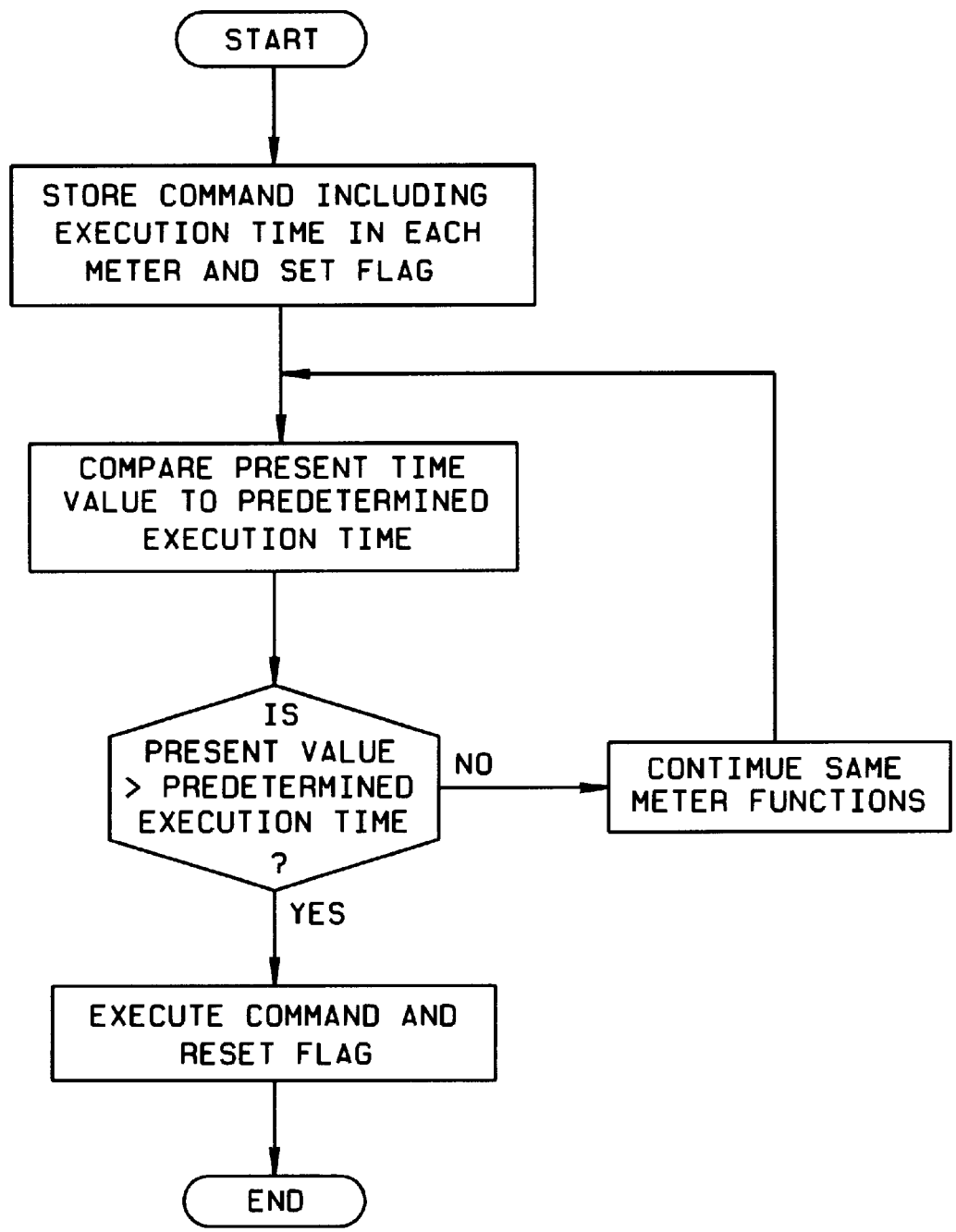
FIG. 4 is a flow chart illustrating the execution of a previously stored command at a predetermined time according to the present invention.

As illustrated in FIG. 4, a command which includes a predetermined execution time for the command is initially provided to each electrical metering device 16 of the electrical metering system. The command may be provided at the same or at different arbitrary times to the electrical metering devices 16. Preferably, a common command including the same predetermined execution time is provided to each of the plurality of electrical metering devices 16.

The communications interface means 30 and, in particular, the memory means 31 of the communications interface means 30 receives and stores the command. In one embodiment, a flag is set in the communications interface means 30 to indicate that a command is awaiting execution. Upon the setting of the flag, the present time value provided by the clock means 28 is thereafter monitored and compared, at set intervals, with the predetermined execution time of the stored command. The set interval may be any desired length of time, such as one minute. Once the present time value equals or exceeds the predetermined execution time of the stored command, the command is transferred from the memory means 31 of the communications interface means 30 to the controlling means for execution. A common command which was previously received and stored may thus be simultaneously executed in a plurality of electrical metering devices 16.

In the drawings and specification, there has been set forth a preferred embodiment of the invention, and although specific terms are employed, the terms are used in a generic and descriptive sense only and not for purpose of limitation, the scope of the invention being set forth in the following claims.

What is claimed is:

1. An electricity metering system comprising:

a plurality of electricity metering devices, each of said metering devices configured to be coupled to a respective load;

means for remotely initiating communication with, and for providing a set of instructions to, said metering devices, said set of instructions comprising a designation of a predetermined execution time for a command, said means providing said set of instructions to said metering devices at arbitrary times which are independent of said predetermined execution time; and each said metering device comprising:

metering means for measuring energy consumption of the corresponding load;

means for storing said set of instructions, including said predetermined execution time, provided by said means for providing said set of instructions at an arbitrary time which is independent of said predetermined execution time;

clock means for providing a present time value; and means responsive to said clock means for executing said set of instructions if said present time value is at least as large as said predetermined execution time such that said set of instructions is executed substantially simultaneously in said plurality of metering devices at said predetermined execution time, notwithstanding that said set of instructions was provided to said metering devices at arbitrary times which are independent of said predetermined execution time.

2. The system according to claim 1 wherein each metering device further comprises means for comparing said present time value provided by said clock means and said predetermined execution time of the stored set of instructions.

3. The system according to claim 1 wherein each said clock means includes a real time clock.

4. The system according to claim 3 wherein said executing means includes means for executing said set of instructions once said present time value provided by said real time clock equals said predetermined execution time such that said set of instructions is executed at a predetermined real time in each of said plurality of metering devices.

5. The system according to claim 1 wherein each metering device further comprises register means, responsive to said metering means, for tabulating measured energy consumption of the corresponding load.

6. An electricity metering device configured to be coupled to a load and communicatively coupled within a system comprising a plurality of metering devices, said metering device comprising:

clock means for providing a present time value;

means for receiving, without prompting, and storing a set of instructions, including a predetermined execution time, at an arbitrary time which is independent of said predetermined execution time; and means responsive to said clock means for executing said stored set of instructions if said present time value is at least as large as said predetermined execution time such that said stored set of instructions may be executed at said predetermined execution time and substantially simultaneously with execution of said set of instructions by other metering devices in the system, notwithstanding that said set of instructions was received and stored at said arbitrary time which is independent of said predetermined execution time.

7. An electricity metering device according to claim 6 further comprising means for comparing said present time value provided by said clock means and said predetermined execution time of said stored set of instructions.

8. An electricity metering device according to claim 6 further comprising register means, responsive to said metering means, for tabulating measured energy consumption of the corresponding load.

9. A method for executing a set of instructions in a plurality of electricity metering devices wherein each metering device includes an associated clock for determining a present time value and is coupled to a load, said method comprising the steps of:

remotely initiating communication with the plurality of metering devices and providing the metering devices with a set of instructions including a predetermined execution time;

storing the set of instructions in each of the plurality of metering devices said step of storing occurring at an arbitrary time which is independent of the predetermined execution time; and individually executing, in each metering device, the previously stored set of instructions once the present time value determined by the clock associated with the respective metering device is at least as large as the predetermined execution time stored in the metering device such that the previously stored set of instructions may be substantially simultaneously executed at the predetermined execution time in the plurality of metering devices, notwithstanding that the previously stored set of instructions was stored at the arbitrary time which is independent of the predetermined execution time.

10. The method according the claim 9 wherein said monitoring step comprises the step of individually comparing the present time value determined by monitoring the clock associated with each metering device with the corresponding predetermined execution time for the metering device.

11. The method according to claim 9 wherein the set of instructions, including the predetermined execution time, stored in each of the plurality of metering devices is identical and wherein said executing step comprises the step of executing the identical set of instructions in each of the plurality of metering devices.

12. The method according to claim 9 wherein said execution step comprises the step of individually executing the set of instructions in each metering device once the present time value determined by monitoring the clock associated with a metering device equals the predetermined execution time stored in the metering device.

13. The method according to claim 9 wherein each of the plurality of metering devices includes memory means for storing a set of instructions, and wherein said storing step comprises the step of storing the set of instructions in the memory means of each metering device.

14. The method according to claim 13 wherein said storing step comprises the step of storing the set of instructions in the memory means of at least one metering device prior to storing the set of instructions in the memory means of the remainder of the plurality of metering devices.

15. The method according to claim 13 wherein each of the plurality of metering devices further includes means for controlling the operation of the metering device, and wherein said storing step further comprises the step of setting a flag in the memory means once the set of instructions is stored and prior to said monitoring and executing steps.

16. The method according to claim 13 wherein said storing step is preceded by the step of transmitting the set of instructions to the plurality of metering devices via an electrical power line.

17. A method for simultaneously executing a common set of instructions, the set of instructions including a predetermined execution time, in a plurality of electricity metering devices wherein each metering device is coupled to a load and includes a real time clock for providing a present time value and memory means for storing a set of instructions, said method comprising the steps of:

remotely initiating communication with the plurality of metering devices and providing the metering devices with a set of instructions including a predetermined execution time;

storing the common set of instructions in the memory means of each of the plurality of metering devices, said step of storing occurring at arbitrary times which are independent of the predetermined execution time;

comparing the present time value provided by the real time clock of each metering device with the predetermined execution time of the set of instructions stored in the memory means of each metering device; and individually executing the set of instructions in each respective metering device once the present time value provided by the real time clock of the respective metering device equals the corresponding predetermined execution time stored in the memory means of the respective metering device such that a previously stored common set of instructions may be substantially simultaneously executed at a predetermined execution time in a plurality of metering devices at a predetermined real time, notwithstanding that the set of instructions was stored in the plurality of electrical metering devices at arbitrary times which are independent of the predetermined execution time.

18. The method according to claim 17 wherein said storing step comprises the step of storing the set of instructions in at least one metering device prior to storing the set of instructions in the remainder of the plurality of metering devices.

19. The method according to claim 17 wherein each of the plurality of metering devices further includes means for controlling the operation of the metering device, and wherein said storing step is followed by the step of setting a flag in the memory means, prior to said comparing and executing step.

20. Apparatus for communicating with a plurality of electricity metering devices, said apparatus comprising a command unit configured to remotely initiate communication with, and for providing a set of instructions to, said metering devices, said set of instructions comprising a designation of a predetermined execution time for a command, said unit configured to provide said set of instructions to the metering devices at arbitrary times which are independent of said predetermined execution time, so that the metering devices substantially simultaneously execute said set of instructions.

21. An electricity metering system comprising:

a plurality of electricity metering nodes; and a command unit configured to remotely initiate communication with, and for providing a set of instructions to, said nodes, said set of instructions comprising a designation of a predetermined execution time for a command, said unit providing said set of instructions to said metering nodes at arbitrary times which are independent of said predetermined execution time, so that said nodes substantially simultaneously execute said set of instructions.

22. A system in accordance with claim 4 wherein each of said nodes comprises means for storing said set of instructions, including said predetermined execution time, provided by said command unit, clock means for providing a present time value, and means responsive to said clock means for executing said set of instructions if said present time value is at least as large as said predetermined execution time such that said set of instructions is executed substantially simultaneously in said plurality of nodes at said predetermined execution time, notwithstanding that said set of instructions was provided to said nodes at arbitrary times which are independent of said predetermined execution time.

23. A system in accordance with claim 22 wherein each node further comprises means for comparing said present time value provided by said clock means and said predetermined execution time of the stored set of instructions.

24. A system in accordance with claim 22 wherein each said clock means includes a real time clock.

25. A system in accordance with claim 24 wherein said executing means includes means for executing said set of instructions once said present time value provided by said real time clock equals said predetermined execution time such that said set of instructions is executed at a predetermined real time in each of said plurality of nodes.

* * * * *